(12) United States Patent
Hauptner et al.

(10) Patent No.: US 6,867,597 B2
(45) Date of Patent: Mar. 15, 2005

(54) METHOD AND APPARATUS FOR FINDING A FAULT IN A SIGNAL PATH ON A PRINTED CIRCUIT BOARD

(75) Inventors: Lenart Hauptner, Landshut (DE); Volker Kilian, München (DE); Richard Roth, Uterhaching (DE); Stefan Sommer, Fürth (DE)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 10/292,847

(22) Filed: Nov. 12, 2002

(65) Prior Publication Data

US 2003/0090273 A1 May 15, 2003

(30) Foreign Application Priority Data

Nov. 9, 2001 (DE) .......................................... 101 55 467

(51) Int. Cl.⁷ .............................................. G01R 31/11
(52) U.S. Cl. ....................................... 324/533; 324/534
(58) Field of Search ........................ 324/761, 500–537, 324/763, 755, 765, 158.1, 73.1

(56) References Cited

U.S. PATENT DOCUMENTS

| | | | | |
|---|---|---|---|---|
| 5,491,427 A | * | 2/1996 | Ueno et al. ................. | 324/754 |
| 5,841,296 A | * | 11/1998 | Churcher et al. ............. | 326/49 |
| 5,977,773 A | * | 11/1999 | Medelius et al. ............ | 324/520 |
| 6,191,601 B1 | * | 2/2001 | Swart .......................... | 324/761 |
| 6,369,601 B1 | * | 4/2002 | Ishigaki ....................... | 324/765 |
| 6,512,377 B1 | * | 1/2003 | Deng et al. .................. | 324/533 |
| 6,570,397 B2 | * | 5/2003 | Mayder et al. ............. | 324/754 |
| 6,697,766 B2 | * | 2/2004 | Qian et al. .................. | 702/189 |
| 2003/0218463 A1 | * | 11/2003 | Stierman et al. ............ | 324/534 |

FOREIGN PATENT DOCUMENTS

DE   199 23 384 A1   11/2000

* cited by examiner

*Primary Examiner*—N. Le
*Assistant Examiner*—Jeff Natalini
(74) *Attorney, Agent, or Firm*—Laurence A. Greenberg; Werner H. Stemer; Ralph E. Locher

(57) ABSTRACT

In the case of the present-day trend of miniaturizing housed electronic devices, there is the problem that the contact spacings between the terminal pins becomes smaller and smaller and are no longer visible optically. As a result, it also becomes more difficult to solder the contacts of correspondingly designed contact bases, which for example, are designed as test bases, to the individual conductor tracks of the printed circuit board. Possible faulty soldering points, short circuits or interruptions have hitherto been tracked down by laborious manual measurement using the TDR method. The invention proposes producing a test device in which in each case two terminal pins are connected to a short-circuiting bridge. The test device is inserted into the contact base and connects two signal paths of the printed circuit board on which the propagation time of a reflected wave can be measured.

10 Claims, 2 Drawing Sheets

MEASURING AND CONTROL DEVICE

MEASURING AND CONTROL DEVICE

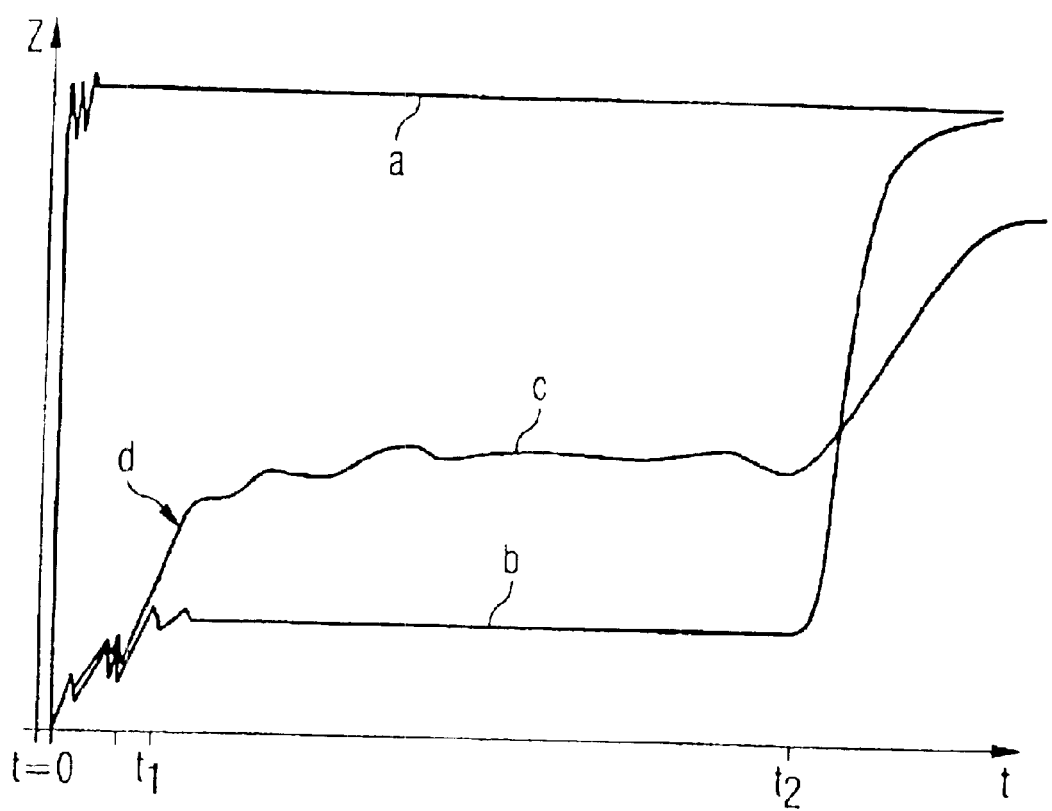

METHOD AND APPARATUS FOR FINDING A FAULT IN A SIGNAL PATH ON A PRINTED CIRCUIT BOARD

BACKGROUND OF THE INVENTION

Field of the Invention

The invention is based on a method and on an apparatus for finding a fault in a signal path on a printed circuit board on which an electronic device will be applied.

It is already known to test, for example, signal paths applied as conductor tracks on a printed circuit board, by using a TDR measurement (Time Domain Reflectometry). In this case, by laborious manual work, a test signal is passed from a corresponding measuring device onto the signal path and the propagation time of the wave that is generally reflected from the open end of the signal path is measured. The characteristic impedance of the signal path (conduction path) is detected during this measurement. If an interruption or a short circuit then occurs on the signal path, for example, at a soldering point, the propagation time of the reflected wave changes, since the test signal is reflected correspondingly earlier at the faulty soldering point. The propagation time is thus a measure of the location of a fault on the signal path. Such a measuring device is available, for example, in the case of commercially available oscilloscopes (e.g. a sampling oscilloscope with a reflectometry measuring device made by Tektronix).

Generally, this fault cannot be discovered by using a simple resistance measurement, since a poor ("cold") soldering point cannot be detected in direct current terms because of other disturbing influences such as different contact resistances at contact points or the like. Moreover, the exact fault location cannot be determined by this method, since only the total resistance in an electric circuit can be measured.

There is a similar problem, for example, in the measurement of housed devices having a so-called test board as a printed circuit board. The test board has one or a plurality of contact bases with a multiplicity of contacts via which a device to be tested is contact-connected, so that a measuring device can set the desired test conditions via corresponding conductor tracks (signal paths).

In the case of the present-day trend toward miniaturization, the spacings between the terminal pins of the housed devices and thus also those of the contacts of the contact base become smaller and smaller, so that entirely satisfactory soldering between the contacts with the associated conductor tracks of the printed circuit board becomes more and more difficult. As a result, incomplete or inadequate soldered connections can arise which, from an electrical standpoint, lead to an interruption and may thus represent a reliability risk during the testing of the devices. Since the conductor tracks and the spacings thereof are also very narrow, interruptions or short circuits can also easily arise during the production process, and cannot readily be identified.

This problem has been solved hitherto by manually testing each conductor track and each contact using the above-mentioned TDR measurement. When there are hundreds of signal paths on a printed circuit board, this testing is highly time-consuming. In addition, it is easily possible for new faults to creep in again.

SUMMARY OF THE INVENTION

It is accordingly an object of the invention to provide a method for finding a fault in a signal path on a printed circuit board constructed for applying an electronic device thereon and an apparatus for performing the method, which overcome the above-mentioned disadvantages of the prior art methods and apparatus of this general type.

In particular, it is an object of the invention to improve the manner in which faults in a signal path on a printed circuit board can be found.

With the foregoing and other objects in view there is provided, in accordance with the invention, a method for finding a fault in a first signal path on a printed circuit board constructed for applying an electronic device thereon. The method includes steps of: designing the electronic device as a test device having at least two terminal pins connected to one another by a short-circuiting bridge; using or introducing the electronic device such that the two terminal pins lengthen the first signal path being tested; and testing the first signal path by using a Time Domain Reflectometry method taking account of a propagation time of a reflected wave to thereby determine a faulty location situated in the first signal path.

In accordance with an added feature of the invention, the two terminal pins connect the first signal path to a second signal path on the printed circuit board.

In accordance with an additional feature of the invention, a switch is used to sever the first signal path or the second signal path.

In accordance with another feature of the invention, the first signal path and the second signal path are tested by using a measuring and control device to sequentially switch the first signal path and the second signal path on or off.

In accordance with a further feature of the invention, the step of testing the first signal path and the second signal path is controlled by using a software program that switches the first signal path and the second signal path.

In accordance with a further added feature of the invention, the step of testing the first signal path and the second signal path is performed automatically.

In accordance with yet an added feature of the invention, the method includes steps of: applying at least one contact base for the electronic device on the printed circuit board; and testing the quality of a soldering point at a contact of the contact base.

In accordance with yet an additional feature of the invention, the method includes steps of: providing the printed circuit board as a multilayer printed circuit board having a plated-through hole; and testing the plated-through hole.

In accordance with yet a further feature of the invention, the method includes steps of: using the two terminal pins to connect the first signal path to a second signal path on the printed circuit board; and testing the first signal path and the second signal path with regard to a fault selected from a group consisting of an interruption and a short circuit.

With the foregoing and other objects in view there is also provided, in accordance with the invention, an apparatus for performing the method. The apparatus includes: a printed circuit board formed as a test board for housed devices; and a measuring and control device for carrying out a TDR measurement. The printed circuit board has at least one contact base with a plurality of contacts.

In accordance with an added feature of the invention, the printed circuit board is a motherboard for a computer.

In accordance with an added feature of the invention, the test board test board is constructed for testing a DRAM memory module, an eDRAM module, or a computer module.

The method for finding a fault in a signal path on a printed circuit board and the apparatus advantageously lengthen the signal path by using a short-circuiting bridge and at least two terminal pins of a test device that is placed directly on the printed circuit board or else is inserted into a contact base. By lengthening the signal path in this manner it is also possible to test the soldering points in direct proximity to the region in which the test module is applied on the printed circuit board, in particular in direct proximity to the contact base that may be provided. Without this measure, the contact of the contact base would form the end of the open line on which the wave is reflected. In this case, a faulty soldering point in this region would no longer be discernible because of the sharply rising characteristic impedance. It is also regarded as particularly advantageous that the arrangement of the measurement construction can be simplified compared with the previously customary arrangement and the testing can thus be carried out more rapidly and more reliably.

It is regarded as particularly advantageous that the two short-circuited terminal pins connect the first signal path to a further signal path on the printed circuit board. As a result, the conduction length of the two signal paths can be lengthened in such a way that, for example, an interruption of the two signal paths or the two soldering points of the corresponding contacts of the contact base can be checked simultaneously. This results in simplifying the testing further and enabling the testing to be carried out more rapidly.

The switching on and off (disconnection) of a signal path is advantageously effected by using switches that connect the signal path to a measuring and control device. In order to form a reflected wave, for the simplest case, one of the two signal paths is severed using the switch, so that the signal can be reflected at the end of the open line.

It appears to be particularly favorable to test all of the signal paths using the measuring and control device since the latter can switch the individual signal paths on or off sequentially. This can be carried out at correspondingly high measurement frequencies in a relatively short time period even if, for example, hundreds of signal paths will be tested on the printed circuit board.

The testing of the signal paths is controlled by the measuring and control device, which uses a software program. Such a program can very easily be adapted to the specific requirements of the printed circuit board types to be tested and can thus be handled highly flexibly.

In particular, the program can control an automatic sequence for testing the signal paths, so that time-consuming manual testing can be eliminated.

The method can be used to test, in particular, the quality of a soldering point or a soldered connection in the region of a contact of the contact base or the like. Thus, by way of example, contact resistances occurring in the region of the contacts can be clearly distinguished from the faulty soldering points situated in this region. As a result, misdiagnoses are avoided and the assessment of the printed circuit board is improved.

Furthermore, it is favorable to use the method to also test, for example, plated-through holes on multilayer printed circuit boards. Since the location of a fault can be accurately determined from the propagation time of the transmitted and reflected waves, it is possible in a simple manner to diagnose which of the plated-through holes is faulty.

A signal path is also advantageously tested with regard to an interruption and/or a short circuit in its conductor tracks. This is virtually impossible to carry out using other methods, for example, in the case of very closely routed or concealed conductor tracks.

In the case of the apparatus, it is regarded as particularly advantageous that the testing is carried out on a test board for housed devices. Such test boards must operate reliably and are relatively expensive to produce, particularly if they have a plurality of contact bases and many hundreds of signal paths.

A preferred application for a test board is seen in testing, for example, integrated circuits such as eDRAM (embedded DRAM) memory modules, computer modules or the like. Very stringent requirements are made of the test boards. They are highly sensitive to damage and are difficult to produce.

Other features which are considered as characteristic for the invention are set forth in the appended claims.

Although the invention is illustrated and described herein as embodied in a method and apparatus for finding a fault in a signal path on a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagram showing signal profiles.

DESCRIPTION OF THE PREFERRED EMBODIMENTS

Figure 1:
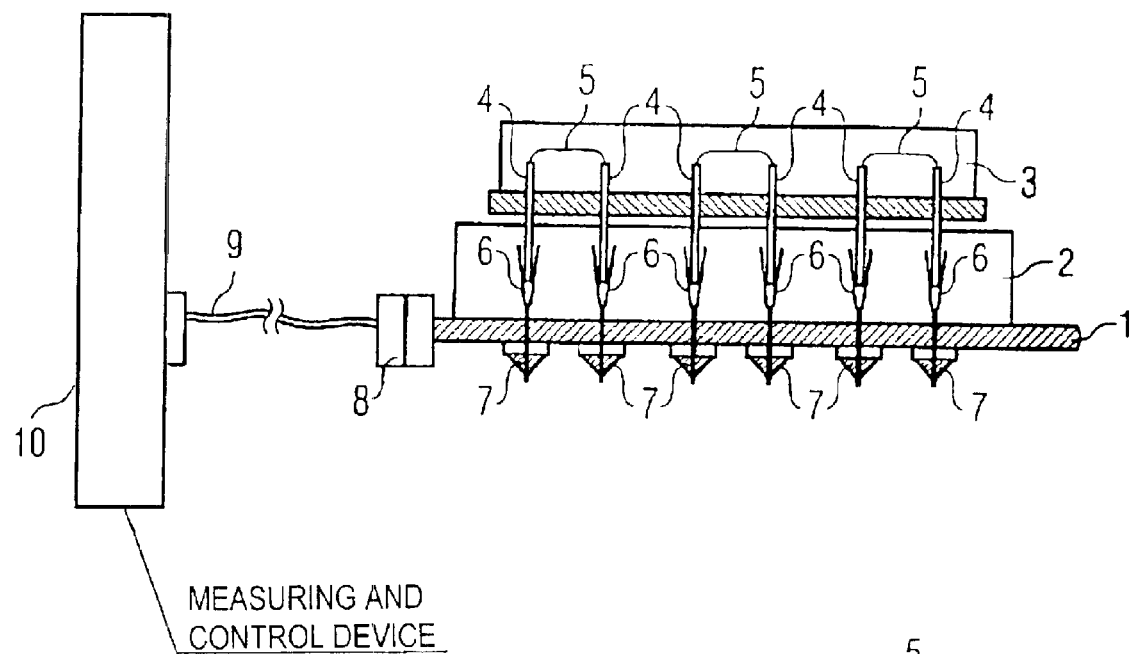
FIG. 1 is a diagrammatic cross sectional view of an exemplary embodiment of the invention.

Referring now to the figures of the drawing in detail and first, particularly, to FIG. 1 thereof, there is shown a diagrammatic cross sectional view of a detail from a printed circuit board 1, which is often also referred to as a printed circuit. Millions of such printed circuit boards 1 are used and are embodied for a wide variety of applications with single- or multilayer conductor track planes. The printed circuit board 1 serves, on the one hand, as a mechanical carrier for the devices of electronic circuits that will be mounted. On the other hand, it carries, at least in the form of Cu tracks, the electrical conductor tracks which, as current or signal paths, connect, supply, control, etc. the individual devices. Particularly in the case of a high packing density of large scale integrated devices such as memory circuits (e.g. eDRAMs, embedded DRAMs), computer chips or the like, it is necessary to arrange a very large number of signal paths in a very confined space. This has the result that the conductor tracks are made very narrow and their mutual spacings are made very small.

Producing such narrow conductor tracks in a very confined space is very difficult, since the conductor tracks are not permitted to have any undesired interruptions or short circuits whatsoever. Plated-through holes to another conduction plane are also critical. A further problem is posed by soldered connections with components such as contact bases 2 having a large number of poles, whose contacts 6 have to be soldered with the conductor tracks.

In the exemplary embodiment shown in FIG. 1, the printed circuit board 1 was designed as a test board on which at least one contact base 2 is arranged. It is assumed that the contact base 2 has hundreds of contacts 6, so that the abovementioned large scale integrated devices such as eDRAMs, computer chips, etc., could also be tested. In the case of such a contact base 2, the contacts 6 have a center-to-center spacing of e.g. 0.8 mm. The conductor tracks are made correspondingly narrow, so that there is very little space available for soldering a contact 6 onto a conductor track. Therefore, undesirable interruptions (e.g. cold soldering points) can occur at the soldering points 7, and are not readily discernible by using a simple resistive measurement or optically, e.g. with BgA bases.

In practice, for the purpose of testing, the terminal pins 4 of a housed device 3 (a specially produced test device in the example shown) are introduced into the contact base 2 of the test board 1. With regard to the size and the properties of the terminal pins 4 of the device 3, the terminal pins 4 are coordinated exactly with the confined spatial conditions. By way of example, the terminal pins 4 may have balls via which electrical connection is effected.

In order to ensure that the test board 1 itself does not have any of the abovementioned faults or deficiencies, in particular, faulty soldering points in the region of the at least one contact base 2, a specially produced test device 3, for example, a daisy chain module or the like, is used in which at least in each case, two (as far as possible adjacent) terminal pins 4 are connected to a short-circuiting bridge 5.

In an alternate configuration of the invention, it is also provided that more than two, for example even all, terminal pins 4 are short-circuited to one another.

FIG. 1 shows a portion of a test device 3 with six terminal pins 4 having a total of three short-circuiting bridges 5. Consequently, each terminal pin 4 is connected via a contact 6 and a soldering point 7 to a conductor track, that is to say a signal path of the test board 1, as will be explained in more detail later with reference to FIG. 2.

The signal paths are individually connected e.g. via a connection plug 8 and connecting lines 9 to a measuring and control device 10. The measuring and control device 10 is known per se and its particulars need not be explained in detail. It has a switching matrix with a multiplicity of switches 22, 23 (See FIG. 2) that are controlled by the control device preferably with a corresponding software program. Furthermore, it has a measuring device which carries out the signal generation and the propagation time measurement of the reflected wave according to the TDR measurement method. The measurement sequence and the sequential switching of the individual signal paths can proceed automatically until all the signal paths of the test board 1 have been fully tested for faults.

The functioning of the inventive method and of the apparatus for finding a fault in a signal path on the printed circuit board, in this case the test board 1, is explained in more detail with reference to FIGS. 2 and 3.

Figure 2:
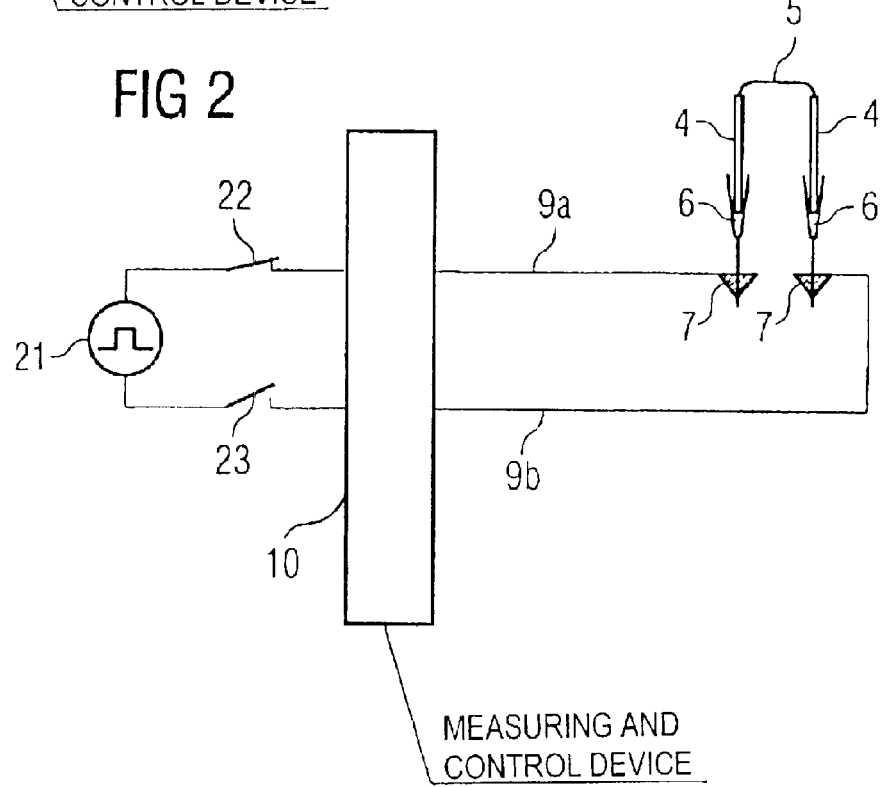
FIG. 2 is a diagram of an electric circuit with two signal paths.

First, FIG. 2 shows a detail from FIG. 1, in which two contacts 6 of a contact base (not illustrated in any further detail), soldering points 7, conductor tracks and connecting lines form the two signal paths 9a, 9b through to the measuring and control device 10. Furthermore, the switches 22, 23 enable each individual signal path 9a, 9b to be switched on or off. Position 21 identifies the TDR measuring device known per se for determining the signal propagation time according to the reflectometry method.

Two terminal pins 4 of the test module 3 are introduced into the two contacts 6, so that the first signal path 9a is connected to the further signal path 9b via the short-circuiting bridge 5.

During the propagation time measurement, then, according to the invention the two switches 22, 23 are controlled in such a way that one switch is opened and the second switch is closed and thus connected to the TDR measuring device 21. In the case of the customary testers, the calibration device can be used for this purpose. In this example, the switch 22 was closed and the switch 23 was opened (under the control of the program). As a result, the signal path 9a to be tested is lengthened by the length of the signal path 9b through to the switch 23. The two soldering points 7 of the two contacts 6 now lie virtually in the center of the lengthened signal path 9a, 9b.

In the normal case, if there is no faulty soldering point or no other fault in the signal path, a wave input at the switch 22 is reflected at the end of the open line, that is to say at the switch 23 in this case, and is detected by the TDR measuring device 21 by measuring the propagation time.

If an interruption then occurs, for example, at one of the two soldering points 7, the wave (signal) fed in at the switch 22 is reflected at the location of the interruption, so that its propagation time is correspondingly shortened. The length of the propagation time and also the change in the characteristic impedance are thus a measure of the location of a fault and indicate the cause.

The same also applies correspondingly to a short circuit, since the propagation time and the characteristic impedance also change in the event of a short circuit between two adjacent signal paths 9a and 9b, and can be correspondingly detected.

According to this scheme, all signal paths of a printed circuit board 1 can then be fully tested automatically under software control.

Of course, the method can also be used for other printed circuit boards 1 with similar problems, such as motherboards for computers or the like. In the case of these printed circuit boards, the module can also be applied directly on the printed circuit board without a contact base. The additional line after the contact that will be tested, i.e. the soldering point in the module is provided e.g. by leads or bonding wires.

FIG. 3 shows three diagrams of signal profiles on which the cases explained above are discussed. In the diagram in FIG. 3, the propagation time t of the reflected wave was plotted on the x-axis and the characteristic impedance Z of a signal path 9a, 9b was plotted on the y-axis.

The upper curve (open line a) in the diagram shows the start pulse having a branch with a sharply rising curve. The diagram shows the start instant t=0. The characteristic impedance Z rises sharply and remains at a high level since this line is open. A reflected wave does not occur since no signal path is connected here.

The lower curve (fault-free signal path b) shows a good, fault-free signal path 9a, 9b, since its lower branch runs horizontally in accordance with the characteristic impedance of the line, for example Z=50 ohms. At the instant t2, this curve also rises sharply since the wave was reflected at the switch 23. The time interval between t=0 and t=t2 corresponds to the total propagation time of the wave, so that the length of the signal path 9a, 9b can be calculated therefrom.

The initial oscillation up to instant t1, which was measured here with 2 ns corresponding to 14 cm, indicates alternating transient states between plug contacts, connecting contacts, etc., and must be considered separately if this is a disturbance.

Curve c shows a faulty soldered connection (interruption). First, curve c runs parallel to curve b approximately up to the instant t1. After this instant t1, however, the curve rises and reaches a higher characteristic impedance until the curve undergoes transition approximately to the straight profile before rising sharply again at the instant t2, because the wave was reflected here at the end of the lengthened signal path 9a, 9b. The arrow d indicates the location of the fault, that is to say the location at which curve c changes from the profile of curve b. The rise indicates an interruption. In the event of a short circuit, this curve branch would run in a manner directed downward.

We claim:

1. A method for finding a fault in a first signal path on a printed circuit board, the method which comprises:

applying an electronic device on the printed circuit board, the electronic device functioning as a test device having at least two terminal pins;

connecting the two terminal pins to one another with a short-circuiting bridge for lengthening the first signal path being tested; and testing the first signal path by using a Time Domain Reflectometry method taking account of a propagation time of a reflected wave to thereby determine a faulty location situated in the first signal path.

2. The method according to claim 1, wherein: the two terminal pins connect the first signal path to a second signal path on the printed circuit board.

3. The method according to claim 2, which comprises using a switch to sever the first signal path or the second signal path.

4. The method according to claim 2, which comprises testing the first signal path and the second signal path by using a measuring and control device to sequentially switch the first signal path and the second signal path on or off.

5. The method according to claim 4, which comprises controlling the step of testing the first signal path and the second signal path by using a software program that switches the first, signal path and the second signal path.

6. The method according to claim 5, wherein the step of testing the first signal path and the second signal path is performed automatically.

7. The method according to claim 4, wherein the step of testing the first signal path and the second signal path is performed automatically.

8. The method according to claim 1, which comprises:

applying at least one contact base for the electronic device on the printed circuit board; and testing the quality of a soldering point at a contact of the contact base.

9. The method according to claim 1, which comprises:

providing the printed circuit board as a multilayer printed circuit board having a plated-through hole; and testing the plated-through hole.

10. The method according to claim 1, which comprises:

using the two terminal pins to connect the first signal path to a second signal path on the printed circuit board; and testing the first signal path and the second signal path with regard to a fault selected from a group consisting of an interruption and a short circuit.

* * * * *